United States Patent
Zhu et al.

(10) Patent No.: US 8,247,278 B2
(45) Date of Patent: Aug. 21, 2012

(54) METHOD FOR MANUFACTURING SEMICONDUCTOR DEVICE

(75) Inventors: Huilong Zhu, Poughkeepsie, NY (US); Chunlong Li, Beijing (CN); Jun Luo, Beijing (CN)

(73) Assignee: Institute of Microelectronics, Chinese Academy of Sciences, Beijing (CN)

( * ) Notice: Subject to any disclaimer, the term of this patent is extended or adjusted under 35 U.S.C. 154(b) by 0 days.

(21) Appl. No.: 13/201,109

(22) PCT Filed: Mar. 3, 2011

(86) PCT No.: PCT/CN2011/071488
§ 371 (c)(1),
(2), (4) Date: Aug. 11, 2011

(87) PCT Pub. No.: WO2012/088796
PCT Pub. Date: May 7, 2012

(65) Prior Publication Data
US 2012/0171833 A1    Jul. 5, 2012

(30) Foreign Application Priority Data
Dec. 31, 2010    (CN) .......................... 2010 1 0617419

(51) Int. Cl.
*H01L 21/336* (2006.01)
(52) U.S. Cl. .. 438/197; 438/199; 257/369; 257/E21.632
(58) Field of Classification Search .................. 438/142, 438/197, 199; 257/213, 288, 368, 369, E21.632, 257/E27.062
See application file for complete search history.

(56) References Cited

U.S. PATENT DOCUMENTS
7,282,766 B2    10/2007    Okuno
(Continued)

FOREIGN PATENT DOCUMENTS
CN    101366122 A    2/2009
CN    100487917 C    5/2009

OTHER PUBLICATIONS
Official International Search Report and Written Opinion of SIPO in counterpart foreign application No. PCT/CN2011/071488, (Oct. 13, 2011).

*Primary Examiner* — Khiem D Nguyen
(74) *Attorney, Agent, or Firm* — Kinney & Lange, P.A.

(57) ABSTRACT

The present application discloses a method for manufacturing a semiconductor device, comprising the steps of: forming a semiconductor substrate, a gate stack and a second protection layer in sequence on a first insulating layer; after defining a gate region and removing portions of the second protection layer and the gate stack outside the gate region, while keeping portions of the stop layer, the semiconductor layer and the second insulating layer which covers sidewalls of the patterned semiconductor layer outside the gate region and exposing the sacrificial layer, performing source/drain ion implementation in the semiconductor layer; after forming a second sidewall spacer so as to cover at least the exposed portion of the sacrificial layer, removing the first protection layer and the second protection layer so as to expose the semiconductor layer and the gate stack; and forming a contact layer on the exposed portion of the semiconductor layer and the gate stack; performing planarization so as to expose the first protection layer, and then removing the first protection layer, the sacrificial layer, the stop layer and the semiconductor layer with the first sidewall spacer and the second sidewall spacer as a mask, so as to form a cavity which exposes the first insulating layer. It facilitates reduction of short channel effects, resistance of source/drain regions, and parasitic capacitance.

19 Claims, 9 Drawing Sheets

U.S. PATENT DOCUMENTS 7,732,859 B2 6/2010 Anderson
2006/0022253 A1* 2/2006 Anderson et al. ............. 257/315
2006/0063332 A1* 3/2006 Doyle et al. ................. 438/267
2006/0267111 A1* 11/2006 Anderson et al. ............. 257/401
2007/0108537 A1* 5/2007 Anderson et al. ............. 257/401

* cited by examiner

METHOD FOR MANUFACTURING SEMICONDUCTOR DEVICE

CROSS-REFERENCE TO RELATED APPLICATION(S)

This application is a National Phase application of, and claims priority to, PCT Application No. PCT/CN2011/071488, filed on Mar. 3, 2011, entitled "Method for Manufacturing Semiconductor Device", which claims priority to Chinese Application No. CN 201010617419.3, filed on Dec. 31, 2010. Both the PCT Application and Chinese Application are incorporated herein by reference in their entireties.

FIELD OF THE INVENTION

The present invention relates to semiconductor technology, and particularly, to a method for manufacturing a semiconductor device.

BACKGROUND OF THE INVENTION

When the channel length of a metal oxide semiconductor field effect transistor (MOSFET) becomes smaller continuously, many negligible effects in the long-channel model of the MOSFET becomes more significant, and has even been a dominant factor determining its properties. These effects are commonly referred to as short channel effects. The short channel effect deteriorates electrical properties of the device, which, for example, leads to a reduced gate threshold voltage, increased power consumption, and a lowered signal-to-noise ratio.

To suppress the short channel effect, the channel has to be doped with more elements such as phosphorus, boron, and the like, which, however, decreases the carrier mobility in the channel of the device. Moreover, it is difficult to provide a steep doping profile in the channel, which in turn leads to a severe short channel effect. Furthermore, conventional strained silicon technology in SiGe PMOS encounters a bottleneck and may not apply larger stress to the channel. Furthermore, there also exists a bottleneck for the thickness of the gate oxide dielectric layer, and thinning of the gate oxide may not follow the decreasing of the gate length. Consequently, the gate dielectric layer has larger leakage. With continuous decrease of the feature size, the resistance for the source/drain regions will increase and the power consumption of the device will become larger.

At present, the main idea in the industry is to improve conventional planar device technology by decreasing thickness of the channel region and eliminating the neutral layer below the depletion layer in the channel so that the depletion layer in the channel occupies the whole channel region, which is referred to as a fully depleted device. As a comparison, the conventional planar device is a partially-depleted device.

However, it is required that the silicon layer in the channel have an extremely small thickness for a fully depleted device. The conventional manufacturing process, especially the conventional manufacturing process on the basis of bulk silicon, is difficult to provide a semiconductor structure as required, or has a high manufacturing cost. Even for an emerging SOI (silicon-on-insulator) process, it is still difficult for a silicon layer in the channel to have a small thickness. With respect to the implementation of a fully depleted device, researches are focused on three-dimensional device designing, i.e. fully depleted double-gate or three-gate technology.

The three-dimensional device, which is also referred to as a vertical device, is a device in which cross sections of source/drain regions and a gate are not located in the same plane, which is substantially a FinFET (fin-type field effect transistor).

In the three-dimensional device, the source/drain regions are independent parts which are not included in bulk silicon or in a SOI layer. Thus, a fully depleted channel having an extremely small thickness can be made by etching.

Figure 33:
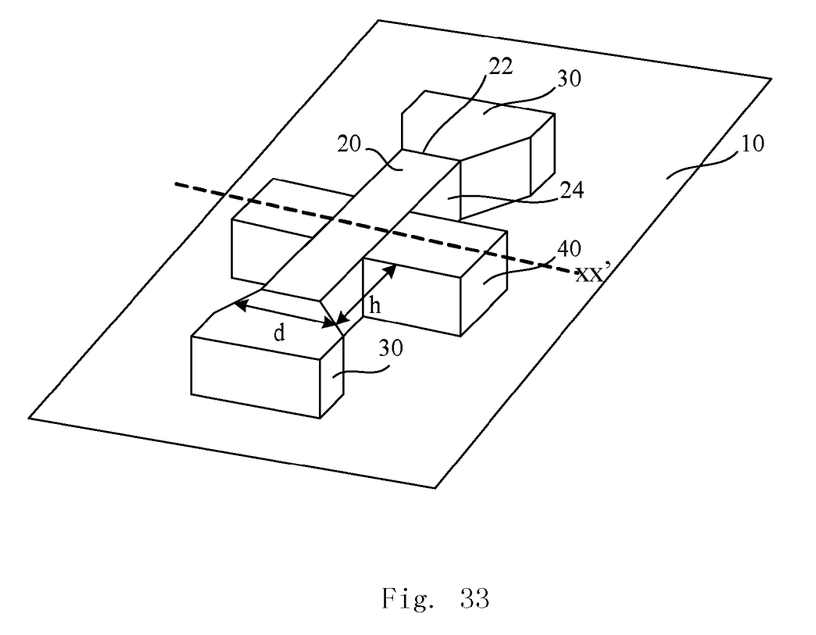
FIG. 33 schematically shows a structure of a semiconductor device in prior art.

One proposed three-dimensional semiconductor device is shown in FIG. 33, which comprises a semiconductor substrate 20 on an insulating layer 10, source/drain regions 30 adjacent to two opposite first sidewalls 22 of the semiconductor substrate 20, a gate 40 on second sidewalls 24 adjacent to the first sidewalls 22 of the semiconductor substrate 20. A gate dielectric layer and a work function metal layer, which are sandwiched between the gate 40 and the semiconductor substrate 20, are not shown in the figure. In the semiconductor device, edge portions of the source/drain regions 30 may be extended so that the width of the source/drain regions 30 in a direction indicated by xx' is larger than the thickness of the semiconductor substrate 20, so as to decrease resistance of the source/drain regions. However, when the width d of the source/drain regions 30 increases, the parasitic capacitance between the source/drain regions 30 and both the gate 40 and the semiconductor substrate 20 will also increase. Consequently, RC (resistance-capacitance) delay increases, or AC (alternating current) characteristic deteriorates.

SUMMARY OF THE INVENTION

To solve the above problem, the present invention provides a method for manufacturing a semiconductor device which facilitates alleviation of short channel effects, and decreasing an electrical resistance between source/drain regions and a parasitic capacitance.

According to the present invention, there is provided a method for manufacturing a semiconductor device, comprising:

a) forming a semiconductor substrate, a gate stack and a second protection layer in sequence on a first insulating layer, wherein the second protection layer covers the semiconductor substrate and the first insulating layer with the gate stack formed between the second protection layer and both the semiconductor substrate and the first insulating layer, and the semiconductor substrate comprises a semiconductor layer, a stop layer, a sacrificial layer and a first protection layer which are stacked and patterned, a first sidewall spacer surrounding the patterned sacrificial layer and the patterned first protection layer, and a second insulating layer covering sidewalls of the patterned semiconductor layer;

b) after defining a gate region and removing portions of the second protection layer and the gate stack outside the gate region while keeping portions of the stop layer, the semiconductor layer and the second insulating layer which covers sidewalls of the semiconductor layer outside the gate region and exposing the sacrificial layer, performing source/drain region ion implementation in the semiconductor layer;

c) after forming a second sidewall spacer so as to cover at least the exposed portion of the sacrificial layer, removing the first protection layer and the second protection layer so as to expose the semiconductor layer and the gate stack, and forming a contact layer on the exposed portion of the semiconductor layer and the gate stack, and d) performing planarization so as to expose the first protection layer, and then removing the first protection layer, the sacrificial layer, the stop layer and the semiconductor layer with the first sidewall spacer and the second sidewall spacer as a mask, so as to form a cavity which exposes the first insulating layer.

According to the present invention, there is also provided a method for manufacturing a semiconductor device, comprising:

a) forming a semiconductor substrate, a second insulating layer, a gate stack and a second protection layer in sequence on a first insulating layer, wherein the second protection layer covers the semiconductor substrate and the first insulating layer with the gate stack and the second insulating layer formed between the second protection layer and both the semiconductor substrate and the first insulating layer, and the semiconductor substrate comprises a semiconductor layer, a stop layer, a sacrificial layer and a first protection layer which are stacked and patterned, and a first sidewall spacer surrounding the patterned sacrificial layer and first protection layer;

b) after defining a gate region and removing portions of the second protection layer and the gate stack outside the gate region, while keeping portions of the first protection layer, the semiconductor layer and the second insulating layer which covers sidewalls of the patterned semiconductor layer outside the gate region and exposing the sacrificial layer, performing source/drain region ion implementation in the semiconductor layer, c) after forming a second sidewall spacer to cover at least the exposed portion of the sacrificial layer, removing the first protection layer and the second protection layer so as to expose the semiconductor layer and the gate stack, and forming a contact layer on the exposed portion of the semiconductor layer and the gate stack; and d) performing planarization to expose the first protection layer, and then removing the first protection layer, the sacrificial layer, the stop layer and the semiconductor layer with the first sidewall spacer and the second sidewall spacer as a mask, so as to form a cavity which exposes the first insulating layer.

Compared with the conventional technology, the technical solution according to the present invention has the following beneficial effects.

In a semiconductor substrate including a channel region having the same thickness as that in the conventional technology, a cavity is formed in the semiconductor substrate so as to increase a distance between the respective gates at the second sidewall of the semiconductor substrate, and further increase a distance between the gate and the source/drain regions, which facilities decrease of a parasitic capacitance. Moreover, due to the existence of the cavity, source/drain regions adjacent to the semiconductor substrate have an increased lateral area, compared with the conventional technology and assuming that the semiconductor substrate has the same height, because the source/drain regions have an increased width, which facilitates decrease of an electrical resistance between the source/drain regions. Furthermore, due to the existence of the cavity, an isolating region is provided between the source/drain regions, which facilitates reduction of short channel effects.

By providing the sacrificial layer on the semiconductor layer on the first insulating layer, and the first and second sidewall spacers around the sacrificial layer, the semiconductor substrate can be processed in a self-aligned manner with the first and second sidewall spacers as a hard mask, which decreases the number of the masks to be used and simplifies the manufacturing process.

By filling the cavity with the third dielectric layer, a possibility of introducing contamination in the cavity is minimized.

DETAILED DESCRIPTION OF PREFERRED EMBODIMENTS

The disclosure below provides various embodiments or examples for carrying out the technical solution of the present invention. Although the components and arrangements of some specific examples are described, they are only examples, and are not construed as limiting the present invention.

Moreover, reference numerals and/or letters are repeated in various embodiments. The repetition is for simplicity and clarity, and does not represent relationship between various embodiments and/or settings to be discussed below.

Various specific processes and/or materials are used in the present invention. Nevertheless, one skilled person in the art will appreciate that other processes and/or materials can also be used as alternatives without departing from the protection scope of the invention. It should be noted that boundaries of various regions described herein include necessary extensions introduced by the process.

According to the present invention, there is provided a method for manufacturing a semiconductor device comprising the following steps.

Figure 1:
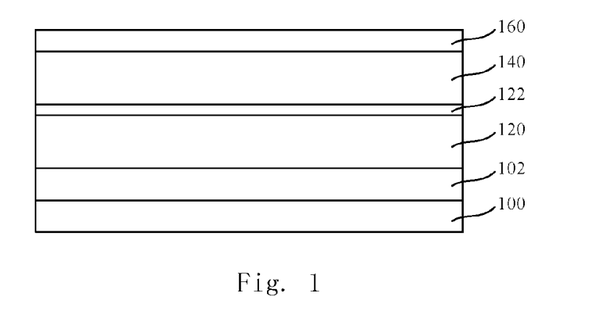
FIG. 1 schematically shows a cross-sectional view of the semiconductor structure after a semiconductor layer, a stop layer, a sacrificial layer and a first protection layer are stacked in a method for forming a semiconductor device according to an embodiment of the present invention.

Firstly, a semiconductor layer 120, a stop layer 122, a sacrificial layer 140 and a first protection layer 160 are formed on a first insulating layer 102, as shown in FIG. 1. The semiconductor layer 120 can be made of silicon, such as SOI (silicon-on-insulator), or other semiconductor materials. The first insulating layer 102 can be formed on a substrate 100, preferably a silicon substrate. The stop layer 122 can be made of silicon oxide, the sacrificial layer 140 can be made of amorphous silicon; and the first protection layer 160 can be made of silicon nitride or silicon carbide.

Figure 2:
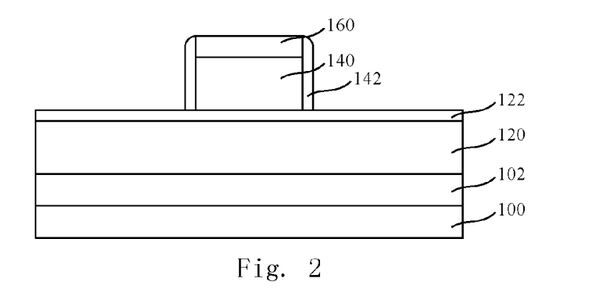
FIG. 2 schematically shows a cross-sectional view of the semiconductor structure after a first sidewall spacer is formed in the method for forming the semiconductor device according to the embodiment of the present invention.

The first protecting layer 160 and the sacrificial layer 140 are then patterned, and a first sidewall spacer 142 is formed on sidewalls of the patterned first protection layer 160 and the patterned sacrificial layer 140, as shown in FIG. 2. An etching process may be performed for patterning, and may stop on top of the stop layer 122. The first sidewall spacer 142 can be made of silicon nitride, and formed by a etching back process.

Figure 3:
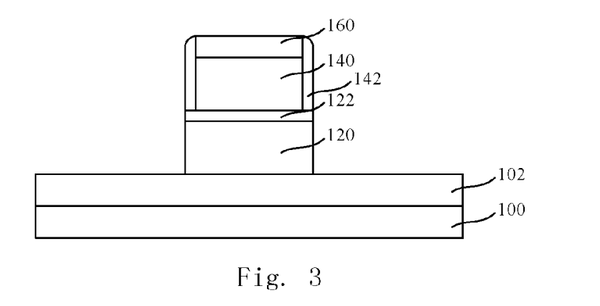
FIG. 3 schematically shows a cross-sectional view of the semiconductor structure after the semiconductor layer is patterned in the method for forming the semiconductor device according to the embodiment of the present invention.

The stop layer 122 and the semiconductor layer 120 are then patterned with the first sidewall spacer 142 as a mask, as shown in FIG. 3. The patterning stops on top of the first insulating layer 102.

Figure 4:
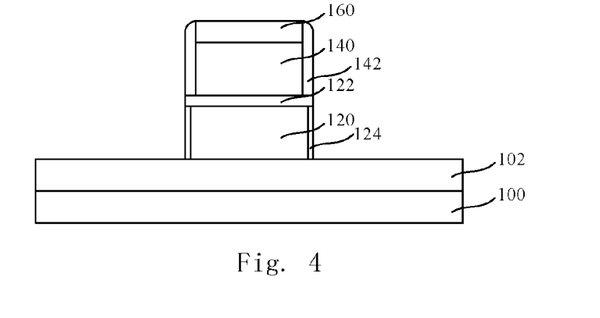
FIG. 4 schematically shows a cross-sectional view of the semiconductor structure after a second insulating layer is formed in the method for forming the semiconductor device according to the embodiment of the present invention.

A second insulating layer 124 is formed on sidewalls of the patterned semiconductor layer 120, as shown in FIG. 4. In the present embodiment, the second insulating layer 124 is formed by thermal oxidation. For example, the second insulating layer 124 is made of silicon oxide. In other embodiments, the second insulating layer 124 can be formed by a deposition process. In such a case, the second insulating layer 124 can be made of a high-K dielectric, such as one selected from a group consisting of $HfO_2$, HfSiO, HfSiON, HfTaO, HfTiO, HfZrO, $Al_2O_3$, $La_2O_3$, $ZrO_2$, LaAlO, and combinations thereof. If the second insulating layer 124 is made of a high-K dielectric, the second insulating layer 124 may cover sidewalls of the first sidewall spacer 142 and the semiconductor layer 120, and the first insulating layer 102. Alternatively, the second insulating layer 124 can also cover only sidewalls of the first sidewall spacer 142 and the semiconductor layer 120, and the portion of the second insulating layer 124 that covers the first insulating layer 102 can be removed by an etching process. A semiconductor substrate is formed after this step.

Figure 5:
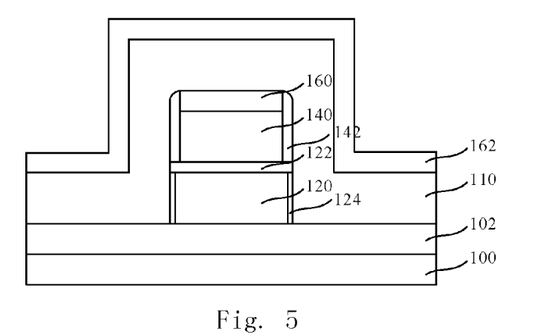
FIG. 5 schematically shows a cross-sectional view of the semiconductor structure after a gate stake and a second protection layer are formed in the method for forming the semiconductor device according to the embodiment of the present invention.

A gate stack 110 and a second protection layer 162 are then formed in sequence, as shown in FIG. 5. In this embodiment, the second protection layer 162 covers the semiconductor substrate and the first insulating layer 102 with the gate stack 110 formed between the second protection layer 162 and both the semiconductor substrate and the first insulating layer 102. In other embodiments where the second insulating layer 124 covers the sidewalls of the first sidewall spacer 142 and the semiconductor layer 120 and the first insulating layer 102, the second protection layer 162 covers the semiconductor substrate and the first insulating layer 102 with the gate stack 110 and the second insulating layer 124 formed between the second protection layer 162 and both the semiconductor substrate and the first insulating layer 102.

In this embodiment, the gate stack 110 can be made of doped or undoped polysilicon. If the gate stack 110 is made of undoped polysilicon, more ions should be implanted into the polysilicon in the subsequent ion implantation so that it is electrically conductive. In other embodiments, the gate stack 110 can be made of a work function layer and a gate conductor layer arranged in sequence (not shown). The work function layer can be made of one selected from a group consisting of TiN, TiAlN, TaN, TaAlN, and combinations thereof. The gate conductor can be made of metals. The second protection layer 162 can be made of silicon oxide or other suitable materials.

The semiconductor layer 120 may have a thickness of about 30 nm-60 nm, such as 35 nm, 40 nm, 45 nm or 50 nm. The stop layer 122 may have a thickness of 5 nm-20 nm, such as 8 nm, 10 nm, 15 nm or 18 nm. The sacrificial layer 140 may have a thickness of about 30 nm-80 nm, such as 40 nm, 50 nm, 60 nm or 70 nm. The first protection layer 160 may have a thickness of about 20 nm-50 nm, such as 25 nm, 30 nm, 35 nm or 40 nm. The first sidewall spacer 142 may have a thickness of about 5 nm-40 nm in a direction parallel to the first insulating layer 102, such as 10 nm, 20 nm, 25 nm or 30 nm.

The second insulating layer 124 may have a thickness of 1 nm-4 nm, such as 2 nm, 2.5 nm, or 3 nm. In a case that the second insulating layer 124 is made of a high-K dielectric, an interfacial oxide layer having a thickness of about 0.2 nm-0.7 nm, such as 0.5 nm may be formed before forming the second insulating layer 124, and is not shown in the figure. The work function metal layer may have a thickness of about 3 nm-10 nm, such as 5 nm, or 8 nm. The gate conductor may have a thickness of about 40 nm-150 nm, such as 60 nm, 80 nm, 100 nm, or 120 nm. In a case that the gate conductor has a relatively small thickness such as about 40 nm-70 nm, a relatively large spacing between the gates of different semiconductor devices may be provided after the gate conductor is formed as a gate, which facilitates subsequent processes. The second protection layer 162 may have a thickness of about 10 nm-40 nm, such as 20 nm, or 30 nm.

Figure 6:
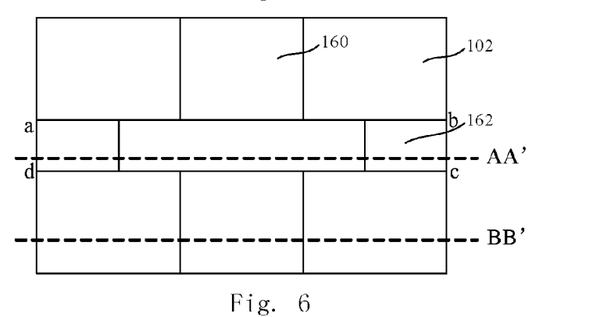
FIGS. 6 to 8 schematically show a top view, a cross-sectional view along AA' direction, and a cross-sectional view along BB' direction of the semiconductor structure after portions of the second protection layer and the gate stack outside the gate region in the method for forming the semiconductor device according to the embodiment of the present invention.
Figure 7:
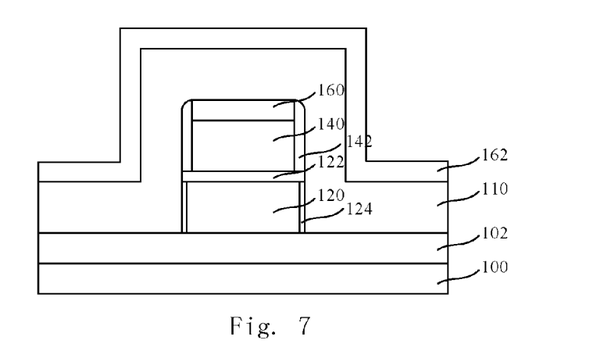
Figure 8:
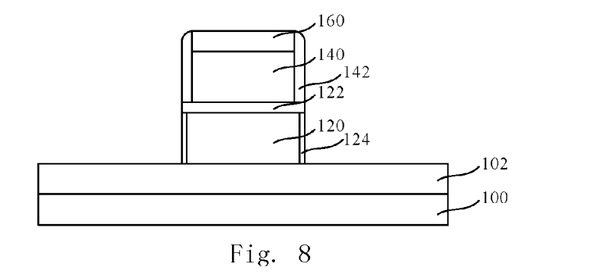

A gate region, which is the region delimited by four points "a", "b", "c" and "d" in FIG. 6, is then defined, and the portions of the second protection layer 162 and the gate stack 110 outside the gate region are removed, as shown in FIGS. 6-8. Dry etching can be used for removing.

Figure 9:
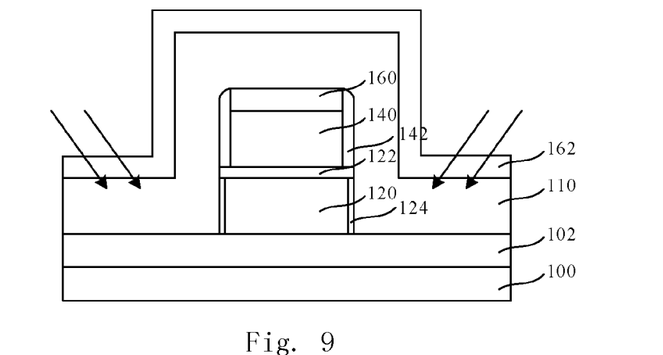
FIGS. 9 and 10 schematically show a cross-sectional view along AA' direction, and a cross-sectional view along BB' direction of the semiconductor structure after ion implantation is performed in the semiconductor layer in the method for forming the semiconductor device according to the embodiment of the present invention.
Figure 10:
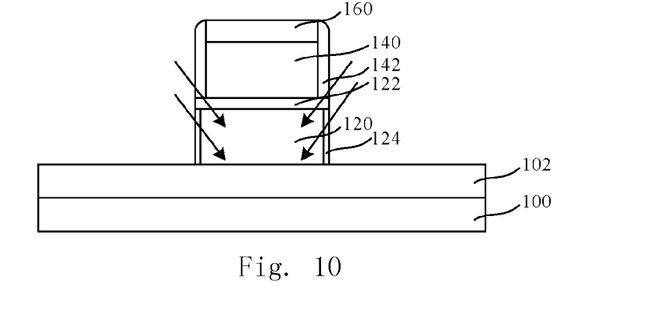

Ion implantation is then performed to the semiconductor layer 120 so as to form source/drain regions (S/D), as shown in FIGS. 9 and 10. After ion implantation, halos and source/drain extensions are formed in the semiconductor layer 120. The ion implantation may include multiple ion implantation steps. It should be noted that the arrows shown in FIGS. 9 and 10 are only used for illustrating the direction of ion implantation, but not for representing the actual direction of ion implantation. As an example, the ion implantation for forming the source/drain regions is performed in a direction parallel to the plane shown in FIGS. 9 and 10, and more specifically, there may be a suitable angle between the direction of ion implantation and the first insulating layer 102. The ion implantation for forming the halos is performed at a predetermined angle to the plane shown in FIGS. 9 and 10. The respective angles can be determined in accordance with the process conditions and the requirement of product. No details are provided for this.

Figure 11:
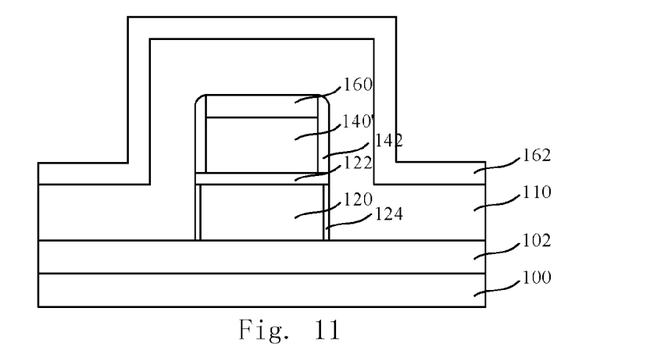
FIGS. 11 and 12 schematically show a cross-sectional view along AA' direction and a cross-sectional view along BB' direction of the semiconductor structure after portions of the first protection layer, the sacrificial layer and the first sidewall spacer outside the gate region are removed in the method for forming the semiconductor device according to the embodiment of the present invention.
Figure 12:
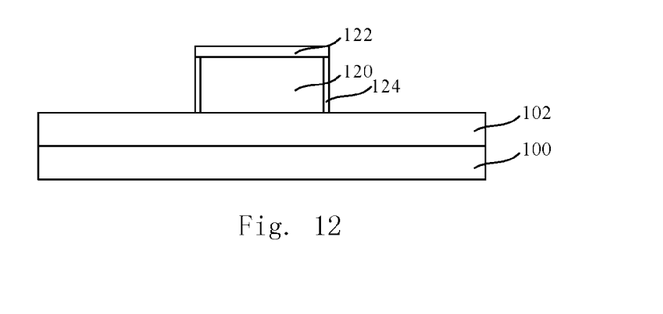
Figure 13:
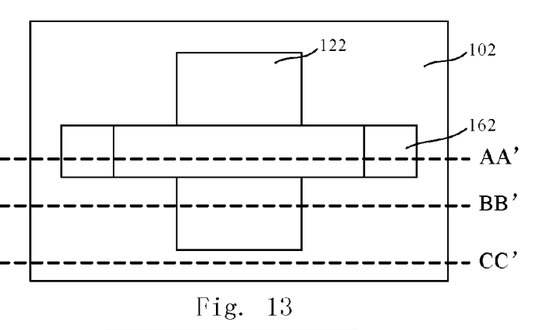
FIGS. 13-16 schematically show a top view, a cross-sectional view along AA' direction, a cross-sectional view along BB' and a cross-sectional view along CC' direction of the semiconductor structure after the gate stack and the semiconductor layer are formed separately in the method for forming the semiconductor device according to the embodiment of the present invention.
Figure 14:
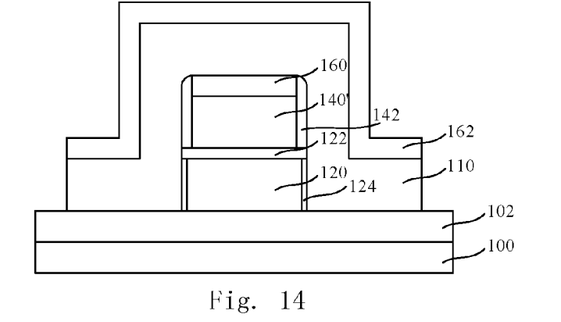
Figure 15:
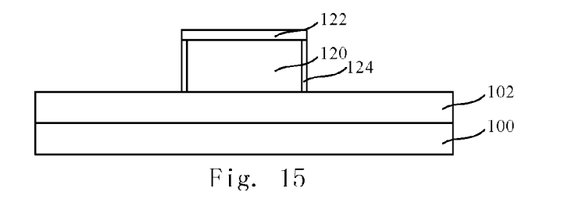
Figure 16:
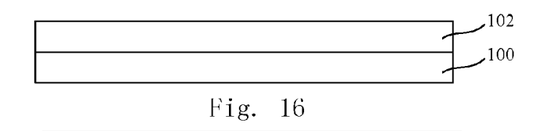

The portions of the first protection layer 160, the sacrificial layer 140 and the first sidewall spacer 142 outside the gate region are then removed so as to expose the portion of the sacrificial layer 140 in the gate region, and more specifically, to expose side surfaces of the sacrificial layer 140, as shown in FIGS. 11 and 12. After this step, an annealing process is then performed. The implanted ions in the semiconductor layer 120 are activated in the annealing process. The annealing temperature can be in the range of about 900° C.-1100° C., such as 1000° C. Moreover, in a case that that the sacrificial layer 140 is made of amorphous, the amorphous silicon is converted into polysilicon after the annealing process, and the sacrificial layer 140 is now denoted by 140'.

The portions of the stop layer 122, the semiconductor layer 120 and the second insulating layer 124 covering sidewalls of the semiconductor layer 120, which are located far away from the gate region, are then removed, and the portions of the second protection layer 162 and the gate stack 110 far away from the semiconductor layer 120 are also removed, so as to expose the first insulating layer 102, as shown in FIGS. 13-16. A lithography process is used for defining the portions to be removed, and an etching process is then performed for removing the portions. In other embodiments, the portions of the stop layer 122, the semiconductor layer 120 and the second insulating layer 124 covering sidewalls of the semiconductor layer 120, which are located far away from the gate region, are also removed, or the portions of the second protection layer 162 and the gate stack 110 far away from the semiconductor layer 120 are also removed, so as to expose the first insulating layer 102. Further, the removing step is even not required. When separate devices are to be formed, the portions of the stop layer 122, the semiconductor layer 120 and the second insulating layer 124 covering sidewalls of the semiconductor layer 120, which are located far away from the gate region, may be cut off, and/or the portions of the second protection layer 162 and the gate stack 110 far away from the semiconductor layer 120 may also be cut off. It can be varied as required by the manufacturing process.

It should be noted that in other embodiments, the portion of the semiconductor substrate far away from the gate region (i.e. the portions of the first protection layer 160, the sacrificial layer 140, the first sidewall spacer 142, the stop layer 122, the semiconductor layer 120 and the second insulating layer 124 covering sidewalls of the semiconductor layer 120, which are located far away from the gate region), and/or the second protection layer 162 and the gate stack 110 far away from the semiconductor layer 120 can be removed firstly, so as to expose the first insulating layer 102. In a case that the second insulating layer 124 covers the first insulating layer 102, the portion of the first insulating layer 102 or the second insulating layer 124 far away from the gate region and the semiconductor layer 120 is exposed. The portions of the first protection layer 160, the sacrificial layer 140 and the first sidewall spacer outside the gate region are then removed, so as to expose the sacrificial layer 140 in the gate region, and more specifically, to expose sidewalls of the sacrificial layer 140. That is, a semiconductor substrate and/or a gate stack is separately formed, and then the portion of the stop layer 122 outside the gate region is then exposed.

Moreover, the annealing process can be performed after the first insulating layer 102 and the second insulating layer 124 are exposed. The annealing process may remove defects in the surface of the semiconductor structure caused by etching.

Figure 17:
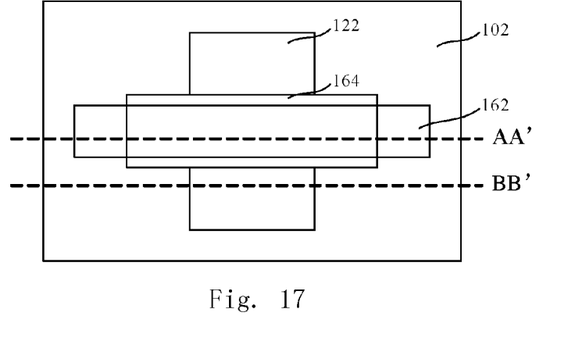
FIG. 17 schematically shows a top view of the semiconductor structure after a second sidewall spacer is formed in the method for forming the semiconductor device according to the embodiment of the present invention.

A second sidewall spacer 164 is then formed, as shown in FIG. 17. The second sidewall spacer 164 is formed by a deposition-etching process, and can have a thickness of about 5 nm-40 nm, such as 10 nm, 20 nm, 25 nm, or 30 nm, in a direction parallel to the first insulating layer 102. No details are provided for this. The second sidewall spacer 164 covers at least the exposed portion of the sacrificial layer 140. In view of the height of the first protection layer 160, the second sidewall spacer 164 may not completely cover sidewalls of the gate stack 110 on the first insulating layer 102, but covers only at least a portion of the exposed sacrificial layer 140 and the portion of the gate stack 110 in the semiconductor substrate that is adjacent to the first insulating layer 102 instead, so as to expose a larger area of the gate stack 110, which facilitates provision of a contact layer having a larger contact area when the contact layer, such as metal silicide, is formed on the gate stack 110 in subsequent processes.

Figure 18:
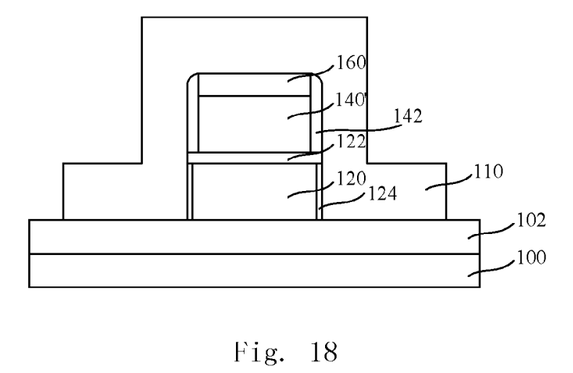
FIGS. 18 and 19 schematically show a cross-sectional view along AA' direction and a cross-sectional view along BB' direction of the semiconductor structure after the semiconductor layer and the gate stack are exposed in the method for forming the semiconductor device according to the embodiment of the present invention.
Figure 19:
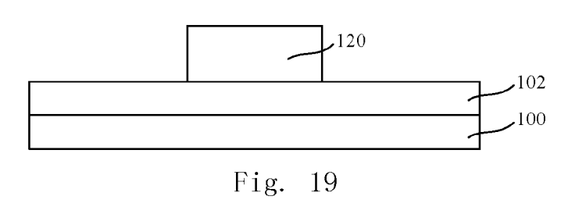
Figure 20:
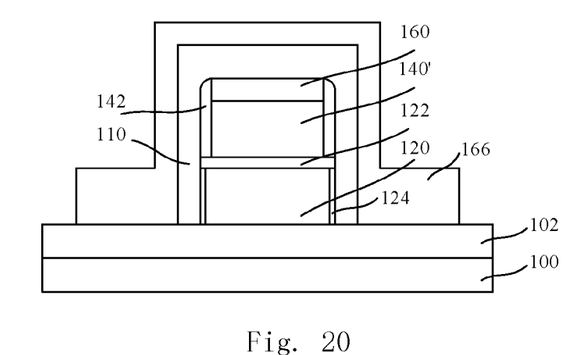
FIGS. 20 and 21 schematically show a cross-sectional view along AA' direction and a cross-sectional view along BB' direction of the semiconductor structure after a contact layer is formed in the method for forming the semiconductor device according to the embodiment of the present invention.
Figure 21:
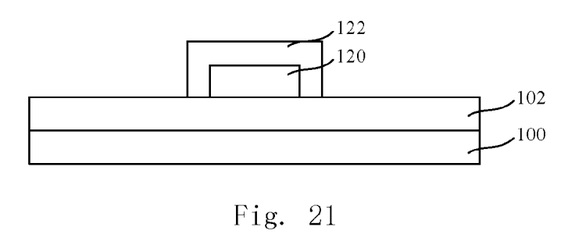

The first protection layer 160 and the second protection layer 162 are then removed so as to expose the semiconductor layer 120 and the gate stack 110, as shown in FIGS. 18-19. In a case that the gate stack 110 is made of polysilicon, a contact layer 166 is then formed on the exposed semiconductor layer 120 and gate stack 110, so as to reduce resistance of the semiconductor device. In this embodiment, the portion of the first insulating layer 102 that is adjacent to the first insulating layer 102 and far away from the semiconductor substrate 110 reacts completely to form the contact layer 166, such as a metal silicide layer. In other embodiments, it is also possible for only the upper part of the portion of the first insulating layer 102 that is adjacent to the first insulating layer 102 and far away from the semiconductor substrate 110 to react so as to form the contact layer 166. Since the metal silicide layer can be formed by a conventional process well known by one skilled person, no details are provided here. In other embodiments, such a process is not required when the gate stack 110 is made of a metal.

Figure 22:
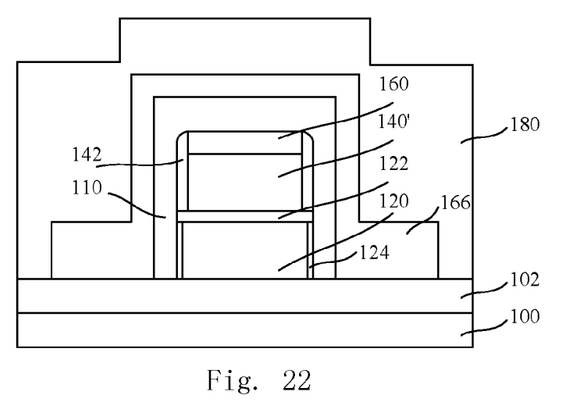
FIGS. 22 and 23 schematically show a cross-sectional view along AA' direction, and a cross-sectional view along BB' direction of the semiconductor structure after a first dielectric layer is formed in the method for forming the semiconductor device according to the embodiment of the present invention.
Figure 23:
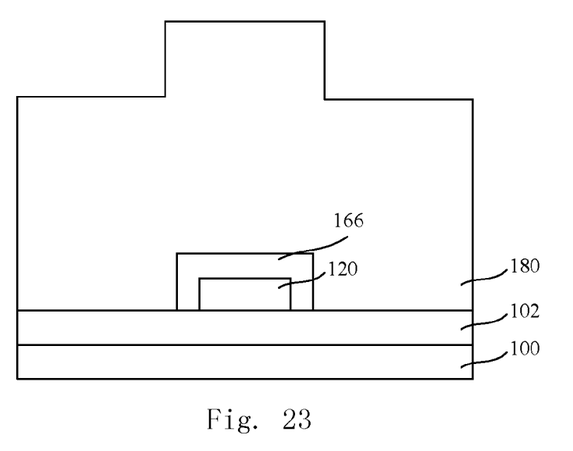
Figure 24:
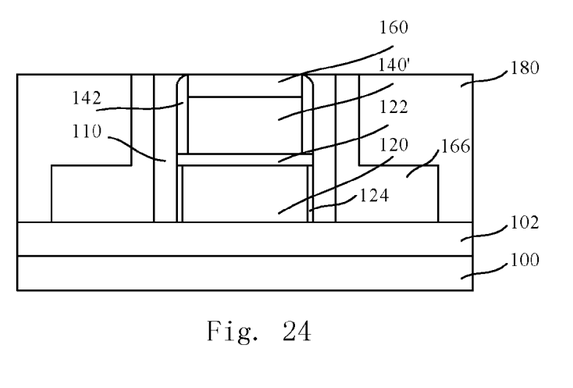
FIGS. 24 and 25 schematically show a cross-sectional view along AA' direction and a cross-sectional view along BB' direction of the semiconductor structure after planarization is performed to expose the first protection layer, the gate stack and a portion of the contact layer in the method for forming the semiconductor device according to the embodiment of the present invention.
Figure 25:
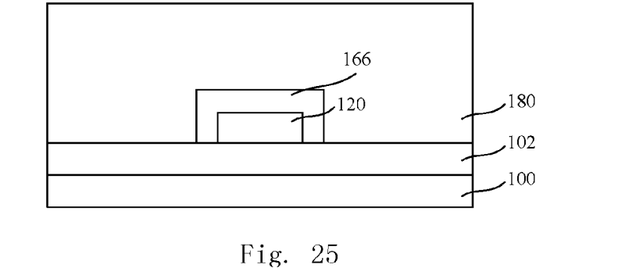
Figure 26:
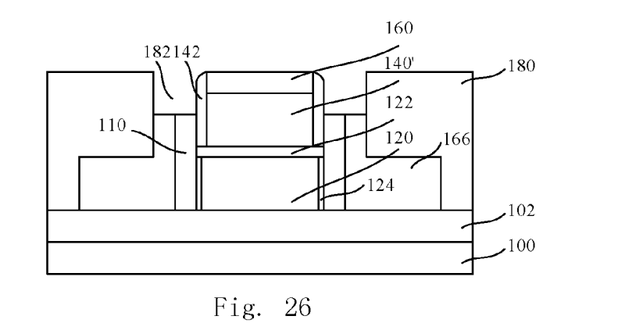
FIG. 26 schematically shows a cross-sectional view along AA' direction of the semiconductor structure after trenches are formed in the method for forming the semiconductor device according to the embodiment of the present invention.
Figure 27:
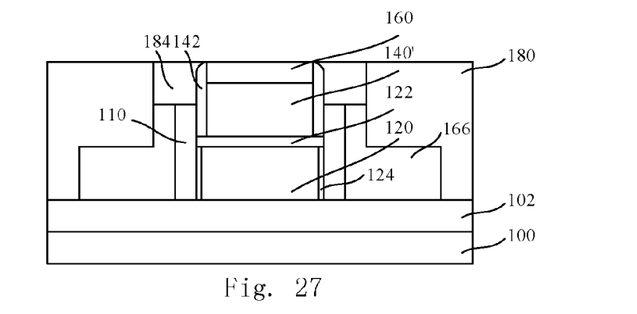
FIG. 27 schematically shows a cross-sectional view along AA' direction of the semiconductor structure after the trenches are filled with a second dielectric layer in the method for forming the semiconductor device according to the embodiment of the present invention.
Figure 28:
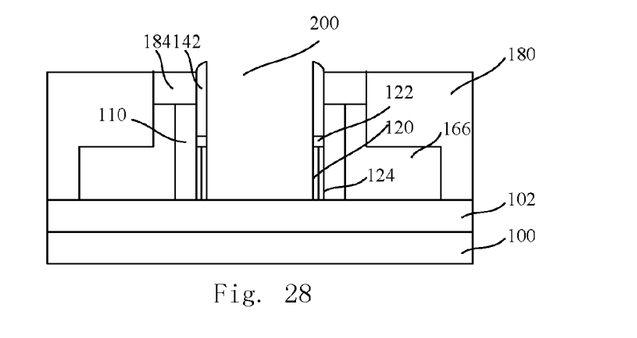
FIGS. 28 and 30 schematically show cross-sectional views along AA' direction of the semiconductor structure after a cavity is formed in the method for forming a semiconductor device according to different embodiments of the present invention.

A first dielectric layer 180, such as silicon oxide, is then formed to cover the contact layer 166, as shown in FIGS. 22 and 23. Planarization, such as chemical mechanical polishing (CMP), is then performed to expose the first protection layer 160, the gate stack 110 and a portion of the contact layer 166, as shown in FIGS. 24 and 25. A portion having a suitable height of the gate stack 110 is then removed to expose a portion of the first sidewall spacer 142 and form a trench 182, as shown in FIG. 26, during which it is also possible for a portion of the contact layer 166 to be removed. Planarization, such as CMP, is then performed to expose the first protection layer 160 after the trench 182 is filled with the second dielectric layer 184, such as silicon oxide, as shown in FIG. 27. Finally, the first protection layer 160, the sacrificial layer 140, the stop layer 122 and the semiconductor layer 120 are removed with the first sidewall spacer 142 and the second sidewall spacer 164 as a mask, so as to form a cavity 200 which exposes the first insulating layer 102, as shown in FIG. 28. In this step, the second dielectric layer 184 may protect the gate stack from being damaged when the sacrificial layer 140' is removed, which ensures that the gate stack is higher than the semiconductor layer 120, and facilitates provision of a channel region as sufficiently as possible when the channel region is formed in the semiconductor layer 120 as having a predetermined thickness.

In other embodiments, an auxiliary contact layer is formed on the exposed portion of the gate stack 110 after the trench 182 is formed. The auxiliary contact layer can be made of the same material as that of the contact layer, such as metal silicide.

Figure 29:
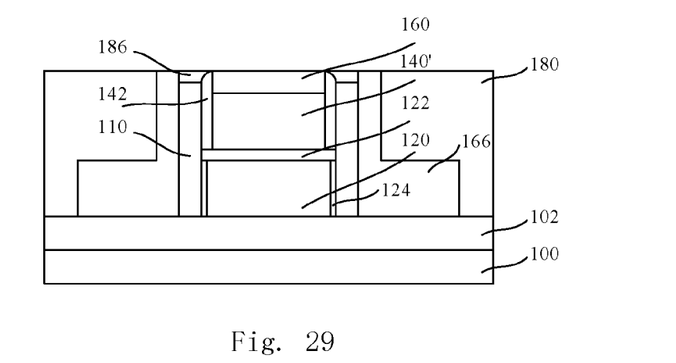
FIG. 29 schematically shows a cross-sectional view along AA' direction of the semiconductor structure after an auxiliary contact layer is formed in the method for forming the semiconductor device according to the embodiment of the present invention.
Figure 30:
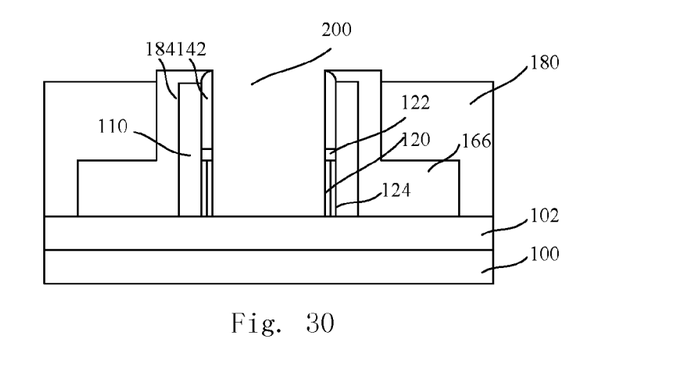

Finally, a first dielectric layer 180, such as silicon oxide, is formed to cover the contact layer 166, as shown in FIGS. 22 and 23. Planarization is then performed to expose the first protection layer 160, the gate stack 110 and a portion of the contact layer 166, as shown in FIGS. 24 and 25. An auxiliary contact layer 186 is then formed on the exposed gate stack 110, as shown in FIG. 29. The first protection layer 160, the sacrificial layer 140, the stop layer 122 and the semiconductor layer 120 are removed with the first sidewall spacer 142 and the second sidewall spacer 164 as a mask, so as to form a cavity 200 which exposes the first insulating layer 102, as shown in FIG. 30. It facilitates increase of a contact area of the contact layer and reduction of resistance of the semiconductor device.

Figure 31:
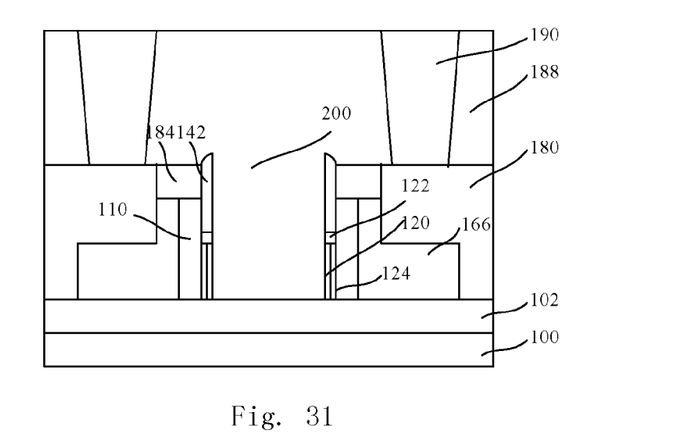
FIGS. 31 and 32 schematically show cross-sectional views along AA' direction of the semiconductor structure after the cavity is filled with a third dielectric layer in the method for forming a semiconductor device according to different embodiments of the present invention.
Figure 32:
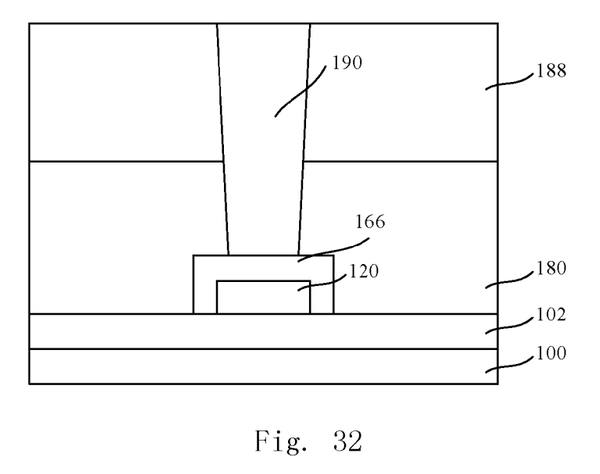

The cavity 200 is then filled with a third dielectric layer 188, such as silicon oxide, as shown in FIGS. 31 and 32. Contact holes 190 are then formed in the third dielectric layer 188 to reach the contact layer 166.

The application of the present invention is not limited to the specific processes, structures, manufacture, materials, means, methods and steps in the above description. On the basis of the above disclosure with respect to the present invention, one skilled person will understand that the existing or future processes, structures, manufacture, materials, means, methods and steps, if having the same or similar functions to those described in the embodiments of the present invention, can also be used according to the teaching in the present invention, without departing from the protection scopes of the present invention.

The invention claimed is:

1. A method for manufacturing a semiconductor device, comprising:
   a) forming a semiconductor substrate, a gate stack and a second protection layer in sequence on a first insulating layer, wherein the second protection layer covers the semiconductor substrate and the first insulating layer with the gate stack formed between the second protection layer and both the semiconductor substrate and the first insulating layer, and the semiconductor substrate comprises a semiconductor layer, a stop layer, a sacrificial layer and a first protection layer which are stacked and patterned, a first sidewall spacer surrounding the patterned sacrificial layer and the patterned first protection layer, and a second insulating layer covering sidewalls of the patterned semiconductor layer;
   b) after defining a gate region and removing portions of the second protection layer and the gate stack outside the gate region while keeping portions of the stop layer, the semiconductor layer and the second insulating layer which covers sidewalls of the semiconductor layer outside the gate region and exposing the sacrificial layer, performing source/drain region ion implantation in the semiconductor layer;
   c) after forming a second sidewall spacer so as to cover at least the exposed portion of the sacrificial layer, removing the first protection layer and the second protection layer so as to expose the semiconductor layer and the gate stack, and forming a contact layer on the exposed portion of the semiconductor layer and the gate stack; and
   d) performing planarization so as to expose the first protection layer, and then removing the first protection layer, the sacrificial layer, the stop layer and the semiconductor layer with the first sidewall spacer and the second sidewall spacer as a mask, so as to form a cavity which exposes the first insulating layer.

2. The method according to claim 1, characterized in that the step a) comprises:
   forming the semiconductor layer, the stop layer, the patterned sacrificial layer and first protection layer, and the first sidewall spacer surrounding the patterned sacrificial layer and first protection layer on the first insulating layer;
   patterning the stop layer and the semiconductor layer with the first sidewall spacer as a mask;
   forming the second insulating layer on sidewalls of the patterned semiconductor layer, so as to provide a semiconductor substrate; and
   forming the gate stack and the second protection layer in sequence so that the second protection layer covers the semiconductor substrate and the first insulating layer with the gate stack formed between the second protection layer and both the semiconductor substrate and the first insulating layer.

3. The method according to claim 2, characterized in that the second insulating layer is formed by a thermal oxidation process.

4. The method according to claim 1, characterized in that halos and source/drain extensions are formed in the semiconductor layer after performing ion implantation.

5. The method according to claim 1, characterized in that the step b) comprises: performing an annealing process to activate the implanted ions in the semiconductor layer after the anneal process.

6. The method according to claim 1, characterized in that between the steps b) and c), it further comprises: exposing the portion of the first insulating layer far away from the gate region and/or far away from the semiconductor layer.

7. The method according to claim 6, characterized in that the step of exposing the portion of the first insulating layer comprises: removing the portions of the stop layer, the semiconductor layer and the second insulating layer covering sidewalls of the semiconductor layer, which are located far away from the gate region, and/or removing the portions of the second protection layer and the gate stack far away from the semiconductor layer.

8. The method according to claim 1, characterized in that the step d) comprises:
   forming a first dielectric layer to cover the contact layer;
   performing planarization so as to expose the first protection layer, the gate stack and a portion of the contact layer;
   removing a portion having a suitable height of the gate stack so as to expose a portion of the first sidewall spacer and form a trench; and
   after the trench is filled with a second dielectric layer, removing the first protection layer, the sacrificial layer, the stop layer and the semiconductor layer with the first sidewall spacer and the second sidewall spacer as a mask, so as to form a cavity which exposes the first insulating layer.

9. The method according to claim 1, characterized in that the step d) comprises:
   form a first dielectric layer to cover the contact layer;
   performing planarization so as to expose the first protection layer, the gate stack and a portion of the contact layer;
   forming an auxiliary contact layer on the exposed portion of the gate stack; and
   removing the first protection layer, the sacrificial layer, the stop layer and the semiconductor layer with the first sidewall spacer and the second sidewall spacer as a mask, so as to form a cavity which exposes the first insulating layer.

10. The method according to claim 1, characterized in that it further comprises forming a third dielectric layer to fill the cavity.

11. A method for manufacturing a semiconductor device, comprising:
   a) forming a semiconductor substrate, a second insulating layer, a gate stack and a second protection layer in sequence on a first insulating layer, wherein the second protection layer covers the semiconductor substrate and the first insulating layer with the gate stack and the second insulating layer formed between the second protection layer and both the semiconductor substrate and the first insulating layer, and the semiconductor substrate comprises a semiconductor layer, a stop layer, a sacrificial layer and a first protection layer which are stacked and patterned, and a first sidewall spacer surrounding the patterned sacrificial layer and first protection layer;
   b) after defining a gate region and removing portions of the second protection layer and the gate stack outside the gate region, while keeping portions of the first protection layer, the semiconductor layer and the second insulating layer which covers sidewalls of the patterned semiconductor layer outside the gate region and exposing the sacrificial layer, performing source/drain region ion implantation in the semiconductor layer;
   c) after forming a second sidewall spacer to cover at least the exposed portion of the sacrificial layer, removing the first protection layer and the second protection layer so as to expose the semiconductor layer and the gate stack, and forming a contact layer on the exposed portion of the semiconductor layer and the gate stack; and
   d) performing planarization to expose the first protection layer, and then removing the first protection layer, the sacrificial layer, the stop layer and the semiconductor layer with the first sidewall spacer and the second sidewall spacer as a mask, so as to form a cavity which exposes the first insulating layer.

12. The method according to claim 11, characterized in that the step a) comprises:
   forming the semiconductor layer, the stop layer, the patterned sacrificial layer and first protection layer, and the first sidewall spacer surrounding the patterned sacrificial layer and first protection layer on the first insulating layer;
   patterning the stop layer and the semiconductor layer with the first sidewall spacer as a mask, so as to form the semiconductor substrate;
   forming the second insulating layer, the gate stack and the second protection layer in sequence so that the second protection layer covers the semiconductor substrate and the first insulating layer with the second insulating layer and the gate stack formed between the second protection layer and both the semiconductor substrate and the first insulating layer.

13. The method according to claim 11, characterized in that halos and source/drain extensions are formed in the semiconductor layer after performing ion implantation.

14. The method according to claim 11, characterized in that the step b) comprises: performing an annealing process to activate the implanted ions in the semiconductor layer after the annealing process.

15. The method according to claim 11, characterized in that between the steps b) and c), it further comprises: exposing the portion of the first insulating layer or the second insulating layer far away from the gate region and/or far away from the semiconductor layer.

16. The method according to claim 15, characterized in that the step of exposing the portion of the second insulating layer comprises:
   removing the portions of the first insulating layer, the semiconductor layer and the second insulation layer covering sidewalls of the semiconductor layer, which are located far away from the gate region, and/or removing the portions of the second protection layer and the gate stack far away from the semiconductor layer.

17. The method according to claim 11, characterized in that the step d) comprises:
   forming a first dielectric layer to cover the contact layer;
   performing planarization so as to expose the first protection layer, the gate stack and a portion of the contact layer;
   removing a portion having a suitable height of the gate stack to expose a portion of the first sidewall spacer and form a trench;
   after the trench is filled with a second dielectric layer, removing the first protection layer, the sacrificial layer, the stop layer and the semiconductor layer with the first sidewall spacer and the second sidewall spacer as a mask, so as to form a cavity which exposes the first insulating layer.

18. The method according to claim 11, characterized in that the step d) comprises:
   forming a first dielectric layer to cover the contact layer;
   performing planarization so as to expose the first protection layer, the gate stack and a portion of the contact layer;
   forming an auxiliary contact layer on the exposed portion of the gate stack; and
   removing the first protection layer, the sacrificial layer, the stop layer and the semiconductor layer with the first sidewall spacer and the second sidewall spacer as a mask, so as to form a cavity which exposes the first insulating layer.

19. The method according to claim 11, characterized in that it further comprises: forming a third dielectric layer to fill the cavity.

* * * * *